US006750789B2

(12) United States Patent
Herre et al.

(10) Patent No.: US 6,750,789 B2
(45) Date of Patent: Jun. 15, 2004

(54) DEVICE AND METHOD FOR DETERMINING A CODING BLOCK RASTER OF A DECODED SIGNAL

(75) Inventors: Juergen Herre, Buckenhof (DE); Karlheinz Brandenburg, Erlangen (DE); Thomas Sporer, Fuerth (DE); Michael Schug, Erlangen (DE); Wolfgang Schildbach, Seattle, WA (US)

(73) Assignee: Fraunhofer-Gesellschaft Zur Foerderung, Der Angewandten Forschung E.V. (DE)

( * ) Notice: Subject to any disclaimer, the term of this patent is extended or adjusted under 35 U.S.C. 154(b) by 60 days.

(21) Appl. No.: 10/168,456

(22) PCT Filed: Jan. 10, 2001

(86) PCT No.: PCT/EP01/00241

§ 371 (c)(1), (2), (4) Date: Oct. 25, 2002

(87) PCT Pub. No.: WO01/52240

PCT Pub. Date: Jul. 19, 2001

(65) Prior Publication Data

US 2003/0107503 A1 Jun. 12, 2003

(30) Foreign Application Priority Data

Jan. 12, 2000 (DE) ........................................ 100 00 934

(51) Int. Cl.[7] ................................................ H03M 7/00

(52) U.S. Cl. .................. 341/50; 348/421.1; 375/240.24

(58) Field of Search ............................. 341/50, 65, 67; 348/180, 420.1, 421.1; 375/240.01, 240.24; 382/239; 704/200, 200.1, 203, 219, 500

(56) References Cited

U.S. PATENT DOCUMENTS 5,179,623 A * 1/1993 Dickopp et al. ............ 704/200
5,214,742 A * 5/1993 Edler ......................... 704/203

(List continued on next page.)

FOREIGN PATENT DOCUMENTS

WO WO 99/04572 1/1999
WO WO 99/08425 2/1999

OTHER PUBLICATIONS

Chen, Y., et al., "Extracting coding parameters from pre–coded MPEG–2 video", Oct. 1998, Los Alamitos, CA, IEEEE Computer Soc.

(List continued on next page.)

*Primary Examiner*—Patrick Wamsley
(74) *Attorney, Agent, or Firm*—Beyer Weaver & Thomas LLP

(57) ABSTRACT

In determining a coding block raster on which a decoded signal is based, a segment of the decoded signal is picked out first, said segment beginning at a certain output sampling value of the decoded signal. Said segment is then converted into a spectral representation, whereupon said spectral representation is then evaluated in relation to a predetermined criterion in order to obtain an evaluation result for the segment. This procedure is repeated for a plurality of different segments beginning at different output sampling values each, in order to obtain a plurality of evaluation results. Finally, the plurality of the evaluation results is searched in order to establish the evaluation result that has an extreme value as compared to the other evaluation results, in such a way that it can be assumed that the segment to which this evaluation result is allocated matches the coding block raster on which the decoded signal is based. This method can be used to determine the coding block raster for any decoded signal that has no explicit information about its coding block raster.

11 Claims, 6 Drawing Sheets

U.S. PATENT DOCUMENTS 6,271,771 B1 * 8/2001 Seitzer et al. ................. 341/50
6,424,939 B1 * 7/2002 Herre et al. ................ 704/219
6,496,795 B1 * 12/2002 Malver ....................... 704/203

OTHER PUBLICATIONS

Fletcher, J., "ISO/MPEG Layer 2– Optimum re–encoding of decoded Audio using a MOLE signal", May 1998, Amsterdam, AES Convention.

Keyhl, M., et al., "NMR Measurements on Multiple Generations Audio Coding", Feb. 1994, Amsterdam, AES Convention.

Herre, J., et al., "Enhancing the Performance of Perceptual Audio Coders by Using Temporal Noise Shaping (TNS)", Nov. 1996, Los Angeles, AES Convention.

International Search Report, PCT/EPO, Jun. 28, 2001.

International Preliminary Examination Report, PCT/EPO, Nov. 19, 2001.

Johnston, J.D.; Ferreira, A. J.; *Sum–Difference Stero Transform Coding*; ieeee icassp 1992, s. A5A69–571.

* cited by examiner

DEVICE AND METHOD FOR DETERMINING A CODING BLOCK RASTER OF A DECODED SIGNAL

FIELD OF THE INVENTION

The present invention relates in general to the analysis of signals that are coded in arbitrary manner and decoded again, and in particular to the analysis of a decoded signal that has been processed using a coding algorithm that is based on a spectral representation of the original signal.

BACKGROUND OF THE INVENTION AND PRIOR ART

It is generally known to code audio and/or video signals using a specific coding method in order to obtain a coded version of the original signal; the coded version of the original signal basically should differ from the original signal to the effect that the data quantity of the coded signal is smaller than the data quantity of the original signal. In this event, the coding algorithm for obtaining the coded signal from the original signal as well as the decoding algorithm, being in essence the inverted coding algorithm, are referred to as data-reducing coding algorithm.

For data reduction of audio signals, there are various coding algorithms that are subject matter of a number of international standards, such as e.g. MPEG-1, MPEG-2, MPEG-4 or also MPEG-2 AAC (AAC=Advanced Audio Coding), with the latter coding algorithm being described in detail, for example, in international standard ISO/IEC 13818-7.

In the following, reference will be made to FIG. 7 illustrating a block diagram of an MPEG audio coding method. Such an audio coder typically comprises an audio input 70 for inputting a stream of time-discrete sampling values which are, e.g. PCM sampling values having e.g. a width of 16 bits. In an analysis filter bank 71, the stream of time-discrete sampling values is divided into coding blocks or frames of sampling values using a corresponding window function, and is then converted to a spectral representation e.g. by a filter bank or by a Fourier transform or a modified Fourier transform, such as e.g. a modified discrete cosine transform (MDCT). At the output of the analysis filter bank 71, there are thus present consecutive coding blocks or frames of spectral coefficients, with a block of spectral coefficients being the spectrum of a coding block of audio sampling values. Often, a 50% overlap of consecutive coding blocks is employed so that, for each block, a window of e.g. 2048 audio sampling values is observed and 1024 new spectral coefficients are created by such processing.

The time-discrete audio signal at input 70, moreover, is fed into a psychoacoustic model 72 in order to obtain a data reduction, such that, as is known, the masking threshold of the audio signal is calculated as a function of the frequency in order to carry out, in a block 73, designated quantizing and coding, a quantization of the spectral coefficients that is dependent upon the masking threshold.

In other words, the quantization of the spectral coefficients is carried out coarsely such that the quantization noise introduced thereby is still below the psychoacoustic masking threshold calculated by the psychoacoustic model 72, so that this quantization noise is not audible in the ideal case. This procedure has the effect that typically a specific number of spectral coefficients, which are still unequal 0 at the output of the analysis filter bank 71, are set to 0 after quantization since the psychoacoustic model 72 has determined that these are masked by adjacent spectral coefficients and are therefore inaudible.

Also independently of a psychoacoustic or psychooptic model, each quantizer has a specific quantization step width, with spectral values smaller than the step width being set to zero by the quantization. Depending on the quantizer, there is also the possibility that just values that are clearly smaller than the step width are set to zero, whereas values slightly below the step width are rounded up. In most cases, each quantizer sets at least some values to zero, thereby already achieving a data reduction.

After quantization, there is provided a spectral representation of the coding block of time-discrete sampling values in which the quantization noise should possibly be below the psychoacoustic masking threshold. These spectral values that are quantized in data-reducing manner may then be coded, depending on the coder employed, in loss-free manner using entropy coding, which may be e.g. Huffman coding. Due to this, a stream of code words is obtained, to which is added, in a bit stream multiplexer 74, side information that is still required by a decoder, such as information concerning the analysis filter bank, information concerning the quantization, such as e.g. scale factors, or side information concerning additional functional blocks. In case of MPEG-2 AAC, such additional functional blocks are, for example, TNS processing, intensity stereo processing, mid/side stereo processing or a prediction from spectrum to spectrum.

At an output 75 of the coder, which is also referred to as bit stream output, the signal coded in accordance with the coding algorithm illustrated in FIG. 7 is then present in the form of blocks.

With respect to the decoder, the coded signal at the output 75 of the coder shown in FIG. 7 is fed to a bit stream input 80 of a decoder illustrated in FIG. 8 which first carries out a bit stream demultiplexing operation in a block 81, referred to as bit stream demultiplexer, in order to separate the spectral data from the side information. At the output of block 81, there are again available the code words representing the individual spectral coefficients. Using a corresponding table, the code words are decoded in order to obtain quantized spectral values. These quantized spectral values are then processed in a block 82 designated "inverse quantization" in order to calculate back the quantization introduced in block 73 (FIG. 7). At the output of block 82, there are available once more dequantized spectral coefficients which are now transformed to the time domain by means of a synthesis filter bank 83 operating in inverse manner to the analysis filter bank 71 (FIG. 7), in order to obtain the decoded signal at an audio output 84.

When considering the coding/decoding concept illustrated in FIGS. 7 and 8, it becomes clear that a block-oriented method is involved here in which the block generation is effected by the analysis filter bank block 71 of FIG. 7 and in which the block formation is cancelled again only at the audio output 84 of the decoder illustrated in FIG. 8.

It becomes clear furthermore that a lossy coding concept is involved here since the decoded signal present at audio output 84 in general contains less information than the original signal present at audio input 70. By way of the quantizer 73 controlled by the psychoacoustic model 72, information is removed from the original signal present at audio input 70, with this information being not added any more in the decoder, but rather being dispensed with. Seen in purely subjective manner, this waiver of information in the ideal case has not led to quality impairments due to the psychoacoustic model 72 that is matched to the properties of the human ear, but has led merely to a desired data compression.

It is to be pointed out here that the coding concept described with reference to FIG. 7 and FIG. 8 by way of an audio signal is also applied correspondingly to image or video signals in which, instead of the temporal audio signal, a video signal is present and in which the spectral representation is not a spectrum of sound here, but a spectrum of place. As for the rest, video signal compression also involves an analysis filter bank, a psychooptic model, quantization and redundancy coding controlled thereby, with the entire coding/decoding concept taking place blockwise as well.

The decoded signal (in case of the example of FIG. 8, the decoded audio signal at audio output 84) typically is again a stream of time-discrete sampling values based on an underlying coding block raster which, however, is generally not visible in the decoded signal, unless specific precautions are taken.

While the process of decoding is the normal case in the application, namely the transfer and storage of audio and/or image signals, there are nevertheless cases in which it is of interest "to re-translate" a given decoded signal into a bit stream representation. This is of interest in particular in the following cases, if the decoded signal is available only.

Furthermore, it is often necessary to examine coding systems by way of the signals coded and decoded again by the same, for example, to find out why a coder that is not yet known has such a good sound.

In addition thereto, there is a demand in the field of copyright protection to furnish evidence without any doubt that a piece of music or an image was coded originally using a specific coder.

Finally, in the field of transmission, for example, over a plurality of networks of different bandwidth, there is the requirement of again coding a decoded signal in order to convert it to a different bandwidth, for example. In that event, the coder/decoder concept illustrated in FIG. 7 and FIG. 8 is applied to an original audio signal in succession several times. In this regard, there are problems to the effect that so-called tandem coding distortions of subsequent codec stages are introduced if the subsequent codec stations operate on the basis of a different coding block raster than the preceding codec stages. It is understandable that the use of a different coding block raster in a subsequent codec stage introduces audible distortions into the audio signal if the coding block formation was not carried out in exactly the same manner as in the first codec stage, since the concept is based on the formation of short-time spectrums and since in particular the psychoacoustic masking threshold of a coding block is dependent on time-discrete sampling values of the coding block raster.

The technical publication "NMR Measurements on Multiple Generations Audio Coding", Michael Keyhl, Jürgen Herre, Christian Schmidmer, 96th AES Convention, Feb. 26 to Mar. 1, 1994, Amsterdam, Preprint 3803, suggests to overcome tandem coding distortions by introducing an identification mark into a decoded signal, which may be accessed by subsequent coder stages in order to carry out, on the basis of this identification mark, their coding block partitioning of the decoded signal to be coded anew, such that all codec stages in a chain of codec stages make use of the same coding block raster.

Although this method has considerably reduced the tandem coding distortions, it is nevertheless disadvantageous to the effect that the identification mark must be introduced by a decoder and must be extracted again and interpreted by a subsequent coder. Thus, changes are necessary both in a decoder and in a coder. Furthermore, this concept of course is applicable to tandem coding only of such decoded signals that have this identification mark of the coding block raster. For signals that do not have this identification mark, a codec stage in a chain of codec stages of course cannot access an identification mark.

Similar problems or restrictions in flexibility result also in case of the MOLE concept described in "ISO/MPEG Layer 2—Optimum re-Encoding of Decoded Audio using a MOLE Signal", John Fletcher, 104th AES Convention, May 16 to 19, Preprint No. 4706. Generally speaking, there are introduced additional data into the decoded audio signal, which describe in detailed manner in what way the decoded audio signal concerned has been coded and decoded. These data are referred to as MOLE signal. If the decoded audio signal has to be coded again, a specifically designed coder will extract this MOLE signal from the signal to be coded and carry out the individual coding steps on the basis of this signal.

Similar to the concept of the identification mark, a disadvantage here also resides in that the decoder which decodes a coded original signal for the first time has to introduce the signal into the decoded audio signal. Such a decoder thus differs from the usual standard decoders. In addition thereto, a coder that again codes a decoded signal has to extract the determination signal in order to operate accordingly. This, so to speak, second coder also has to be modified such that it can read and interpret the determination signal. Finally, this concept too, unfortunately is effective only for decoded signals having such a determination signal, however not for signals having no such determinations signal.

Both the identification mark and the MOLE determination signal provide information as to which coding block raster is underlying the decoded signal having the identification mark or the MOLE determination signal associated therewith. However, these signals have to be introduced explicitly, thus entailing the flexibility disadvantages described hereinbefore.

SUMMARY OF THE INVENTION

It is the object of the present invention to provide a device and a method for determining a coding block raster, on which a decoded signal is based, for a decoded signal having no explicit hint towards a coding block raster.

In accordance with a first aspect of the present invention, this object is achieved by a device for determining a coding block raster on which a decoded signal is based, in which the decoded signal is produced from an original signal by coding and decoding according to a coding algorithm including a coding block generating step, a conversion step and a data reducing step, said coding block generating step of the coding algorithm including partitioning the original signal according to the coding block raster into coding blocks with a specific number of time-discrete signal values, said conversion step including generating from a coding block a spectral representation of the same, and said data reducing step including removing information from the spectral representation of the original signal, said device comprising: a picker for picking out a segment of the decoded signal, said segment beginning at an output sampling value of the decoded signal; a processor for performing the conversion step on said segment of the decoded signal so as to provide a spectral representation of said segment; an evaluator for evaluating the spectral representation of said segment with respect to a predetermined criterion in order to obtain an evaluation result for the segment, said device for determining a coding block raster being further arranged to pick out, convert and evaluate a plurality of segments of the decoded signal that begin at different output sampling values in order to obtain a plurality of evaluation results; and a searcher for searching the evaluation results and for outputting an identification for the coding block raster underlying the decoded signal, on the basis of the segment that has an extreme evaluation result with respect to other evaluation results.

In accordance with a second aspect of the present invention, this object is achieved by a method for determining a coding block raster on which a decoded signal is based, in which the decoded signal is produced from an original signal by coding and decoding according to a coding algorithm including a coding block generating step, a conversion step and a data reducing step, said coding block generating step of the coding algorithm including partitioning the original signal according to the coding block raster into coding blocks with a specific number of time-discrete signal values, said conversion step including generating from a coding block a spectral representation of the same, and said data reducing step including removing information from the spectral representation of the original signal, said method comprising: picking out a segment of the decoded signal, said segment beginning at an output sampling value of the decoded signal; performing the conversion step on said segment of the decoded signal so as to provide a spectral representation of said segment; evaluating the spectral representation of said segment with respect to a predetermined criterion in order to obtain an evaluation result for the segment, said steps of picking out, performing and evaluating being carried out a plurality of times in order to pick out, convert and evaluate a plurality of segments of the decoded signal that begin at different output sampling values in order to obtain a plurality of evaluation results; and searching the evaluation results and outputting an identification for the coding block raster underlying the decoded signal, on the basis of the segment that has an extreme evaluation result with respect to other evaluation results.

The present invention is based on the finding that the coding block raster, which is defined in virtually random fashion by a block-oriented coder, has a decisive influence on the spectral representation of the signal. Even minimum deviations or coding block raster offsets have the effect that the spectral representation of the decoded signal has a completely different appearance than would actually be expected of a spectral representation of the decoded signal when the same is based on the same coding block raster on which the decoded signal as such is based. In case of data-reducing coding algorithms operating on the basis of a psychoacoustic model or psychooptic model, it is known from the very beginning that, on the basis of quantization using a psychooptic or psychoacoustic masking threshold, a certain number of spectral coefficients is zero.

It is pointed out that also independently of a quantization controlled by a psychoacoustic or psychooptic model, there are usually specific values that are always set to zero, namely those values that are considerably smaller than the quantization step width.

If, however, the coding block raster partitioning for generating a spectral representation of the decoded signal is not in conformity with the coding block raster partitioning on which the decoded signal as such is based, this property does no longer appear in the spectral representation of the decoded signal. However, also with coding concepts that are not necessarily data-reducing or with concepts which, although they would be data-reducing, do not have a significant data reducing effect due to the input signal, a coding block raster offset already has the effect that the spectrum of the decoded signal that is based on a different coding block raster partitioning than the coding block raster partitioning on which the decoded signal is based. This results in a changed spectral structure having a highly "smeared" appearance, which in particular makes itself felt in that the individual spectral components can no longer be separated well from each other.

This characteristic of the spectrum can be utilized as a criterion for finding out whether a coding block raster offset is involved. In case of a spectrum with raster offset, the fluctuation of the e.g. logarithmic amplitude of the spectral coefficients is slower or less abrupt than in case of a spectrum without raster offset in which a rapid or very abrupt fluctuation of the amplitude of the spectral coefficients can be noted.

Generally speaking, a short-time spectrum of the decoded signal generated using a coding block raster partitioning corresponding to the coding block raster partitioning on which the decoded signal is based, has a specific appearance, for example with respect to the separation of the spectral lines, with respect to the number of spectral lines that are equal to zero or are very small, etc.

According to the invention, there is thus a segment of the decoded signal picked out for determining a coding block raster, whereupon the segment picked out is converted into a spectral representation thereof. Thereafter, the spectral representation of the segment picked out is examined with respect to at least one predetermined criterion in order to obtain an evaluation result for the segment. This concept is carried out for various segments, using each time a different coding block raster as basis, so that various evaluation results are obtained for different coding block raster partitionings and thus coding block raster offsets. A coding block raster offset that corresponds best to the predetermined criterion, i.e. that has an evaluation result that is extreme compared to the other evaluation results then will be ascertained among the evaluation results generated by evaluating the spectral representations of the various segments picket out, and will be output. The coding block raster partitioning on which a decoded signal is based thus can be reconstructed unequivocally without the use of an auxiliary signal explicitly contained in the decoded signal.

This concept basically permits to determine from each decoded signal the coding block raster underlying the same and thus provides considerable flexibility to the effect that all decoded signals can be processed, and not only decoded signals that already have an identification mark or a MOLE determination signal. It is thus possible to analyze almost any decoded signals in order to perform distortion-free tandem coding so as to obtain further information on the coding algorithm on which the decoded signal is based, or so as to furnish evidence at all as to which coder was originally used for coding the decoded signal.

Preferably, the coding block raster underlying the decoded signal, as determined according to the invention, can be introduced into the decoded signal proper in order to thus match arbitrary decoded signals for existing codec stages based on the identification mark or the MOLE determination signal.

In addition thereto, the concept according to the invention permits the determination of almost all coding parameters, all the more so as, on the basis of the knowledge of the coding block raster and using corresponding iteration algorithms, virtually all coder functionalities, so to speak, can be "calculated back". The prerequisite therefore is, however, the determination of the coding block raster as such, as the coding block raster influences all ensuing parameters of a coding algorithm that is based on a spectral representation of a signal to be coded. The determination of the coding block raster thus is, so to speak, the "entrance gate" for completely analyzing a decoded signal with regard to the coding/decoding concept underlying the same.

BRIEF DESCRIPTION OF THE DRAWINGS

Preferred embodiments of the present invention will be described in detail hereinafter with reference to the accompanying drawings in which.

DETAILED DESCRIPTION OF PREFERRED EMBODIMENTS

Figure 1:
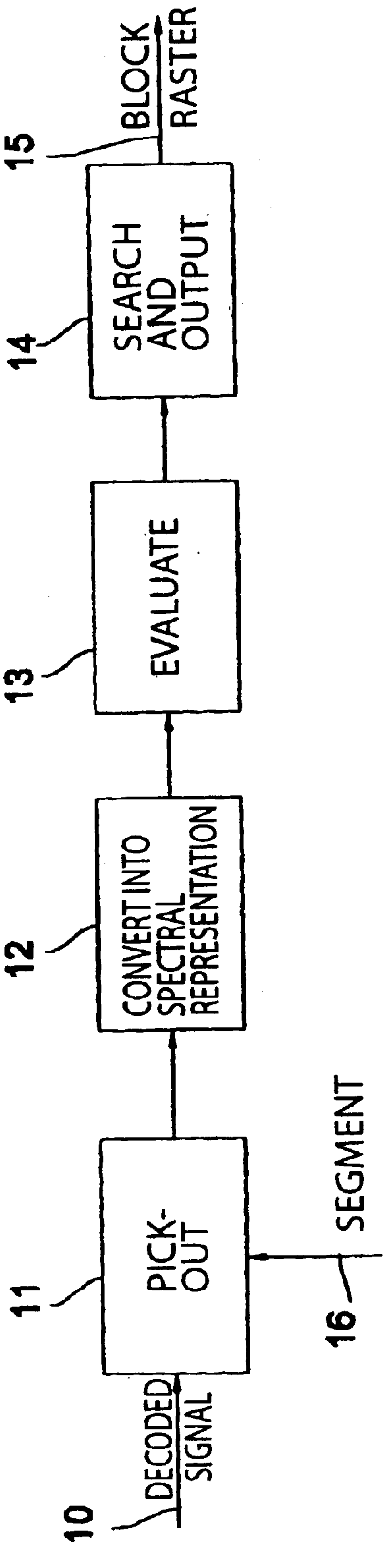
FIG. 1 shows a block diagram of a device according to the invention for determining a coding block raster.

FIG. 1 shows a block diagram of a device according to the invention for determining a coding block raster on which a decoded signal is based. The decoded signal is fed to the device according to the invention at an input 10 and enters means 11 for picking out a segment of the decoded signal. The segment picked out by means 11 is converted into a spectral representation thereof in means 12. The spectral representation of the segment picked out then is evaluated in means 13 in relation to a predetermined criterion in order to obtain an evaluation result for the segment picked out. The evaluation result then is input in means 14 for searching and outputting a plurality of evaluation results, in order to output, at an output 15 of the device according to the invention, the coding block raster on which the decoded signal at the input 10 of the inventive device is based. The device illustrated in FIG. 1 operates in iterative manner such that the means 11 for picking out is capable of picking out, depending on a segment control signal 16, a segment of the decoded signal that is different from a segment picked out previously. The device for determining a coding block raster, according to the invention, thus is arranged to pick out, convert and determine a plurality of segments of the decoded signal that begin at different output sampling values, in order to obtain a plurality of evaluation results. From this plurality of evaluation results, the means 14 then determines the segment picked out that corresponds best to the criterion underlying the evaluation or that, depending on the criterion, corresponds least to the same, in order to thus give a hint towards the coding block raster.

Figure 3:
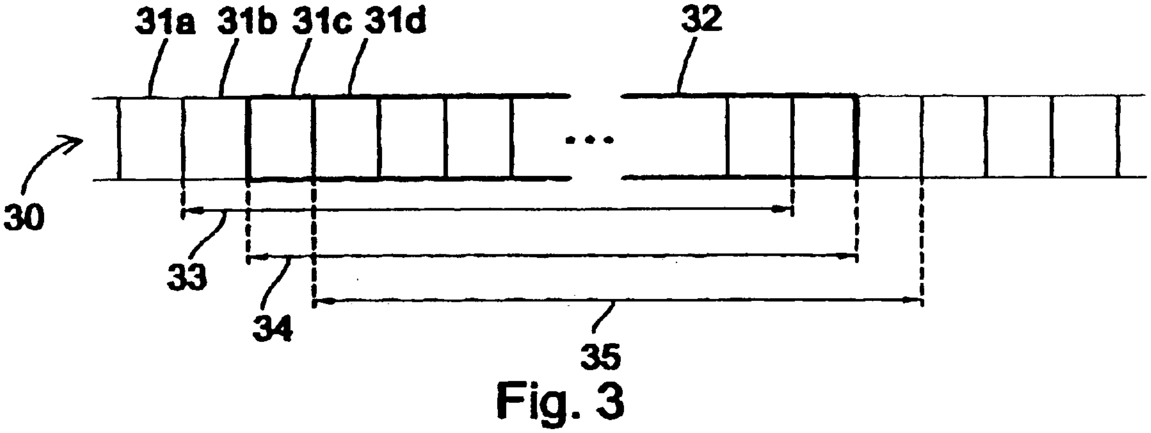
FIG. 3 shows a basic representation of a decoded signal for illustrating various coding block raster offsets.
Figure 8:
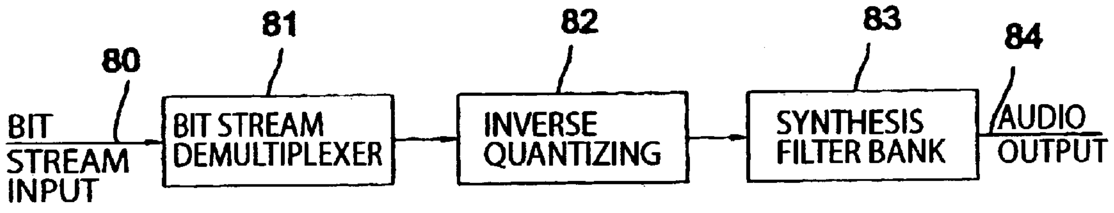
Fig. 8 (PRIOR ART)
FIG. 8 shows a block diagram of a known decoder for decoding signals coded by the coder illustrated in FIG. 7.

In the following, reference will be made to FIG. 3 to illustrate the structure of a decoded signal at the input 10 of the device according to the invention shown in FIG. 1 and the various coding block raster offsets. The decoded signal generally consists of a sequence 30 of time-discrete sampling values generated e.g. by the decoder shown in FIG. 8 at the audio output 84 thereof. In particular, the sequence 30 of time-discrete sampling values of the decoded signal consists of sampling values 31*a*, 31*b*, 31*c*, 31*d*, . . . FIG. 3 furthermore shows, surrounded in bold, a coding block 32 of sampling values that defines the coding block raster partitioning originally underlying the decoded signal 30. FIG. 3 illustrates the case in which no overlap is utilized whereas FIG. 9, which will be dealt with further below, represents a window sequence making use of an overlap of 50%.

The coding block raster, in the sense of the present description, is defined such that a coding block comprises the sampling values that are picked out from the stream of temporal sampling values by analysis windowing. The number of the sampling values in a coding block thus corresponds to the number of sampling values used in windowing, or in other words, to the window length. As there is no overlap of the time windows in FIG. 3, a preceding coding block ends before the coding block 32 illustrated in FIG. 3 in exemplary manner, and a subsequent coding block begins at the end of coding block 32.

Figure 9:
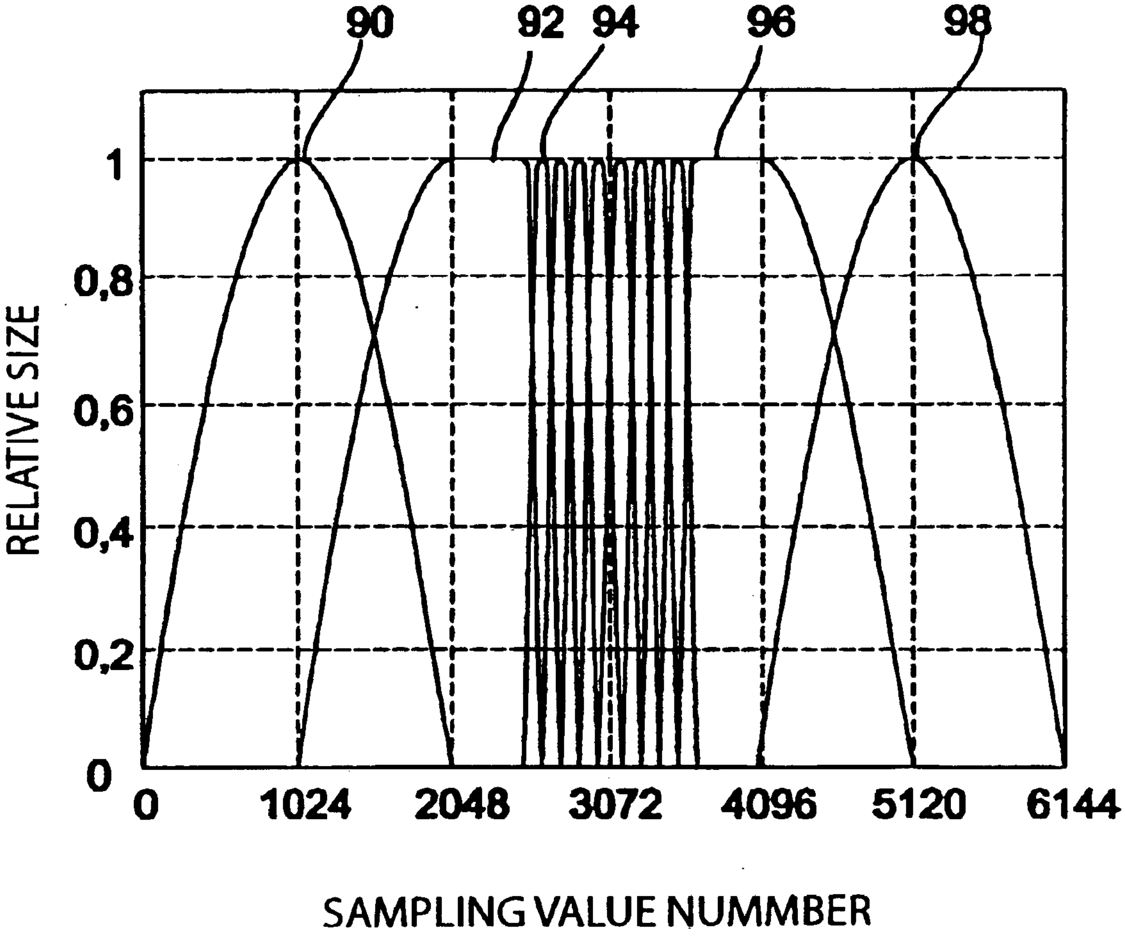
FIG. 9 shows an exemplary window sequence with a degree of overlapping of 50%.

In contrast thereto, FIG. 9 illustrates a window sequence making use of an overlap of 50%. Such a sequence may occur in MPEG-2 AAC. Illustrated along the abscissa of FIG. 9 is the number of a discrete sampling value in a stream of sampling values. Illustrated along the ordinate in FIG. 9 is the relative size of the window, i.e. the factor with which a sampling value is weighted in windowing.

The window sequence in FIG. 9 comprises a "long" window 90, a so-called start window 92, a succession of eight "short" windows 94, a stop window 96 and another long window 98.

In the standard MPEG-2 AAC, a coder is adapted to switch from a long window to a succession of eight short windows in order to provide for better coding of highly transient time signals. The window sequence in FIG. 9 thus is suitable for processing transient time signals between sampling value No. 2560 and sampling value No. 3584.

In the case illustrated in FIG. 9, a long window comprises 2048 sampling values, whereas a short window comprises 256 sampling values. The eight short windows 94 comprise as many sampling values as a long window 90 or 98. In addition thereto, the start window 92 and the stop window 96 are selected such that, after transition of windowing with long windows to windowing with short windows and after an opposite transition back to windowing with long windows, the coding block raster of n·(1024 sampling values) is maintained. The coding block raster thus is defined here by a long window, i.e. by the number of sampling values comprised by a long window.

In case of an overlap of 50% and a sequence of long windows, each new window comprises 50% of the sampling values that were windowed by the preceding window and 50% "new" sampling values picked out. If an overlap higher than 50% is utilized, the number of "new" sampling values picked out in a coding block decreases, whereas the number of the "old" sampling values increases. The overall number of the sampling values per coding block, however, remains the same.

The device according to the invention for determining a coding block raster thus has to determine only one single coding block of the decoded signal since the coding block raster usually is fixed in a signal and does not change generally, even if short windows are used.

FIG. 3 illustrates furthermore three possibilities of controlling means 11 (FIG. 1) for picking out, namely a first alternative 33 with an offset of one sampling value to the left, i.e. an offset of −1, a second alternative 34 with an offset of 0, and a third alternative 35 with an offset of one sampling value to the right, i.e. an offset of +1.

Figure 2:
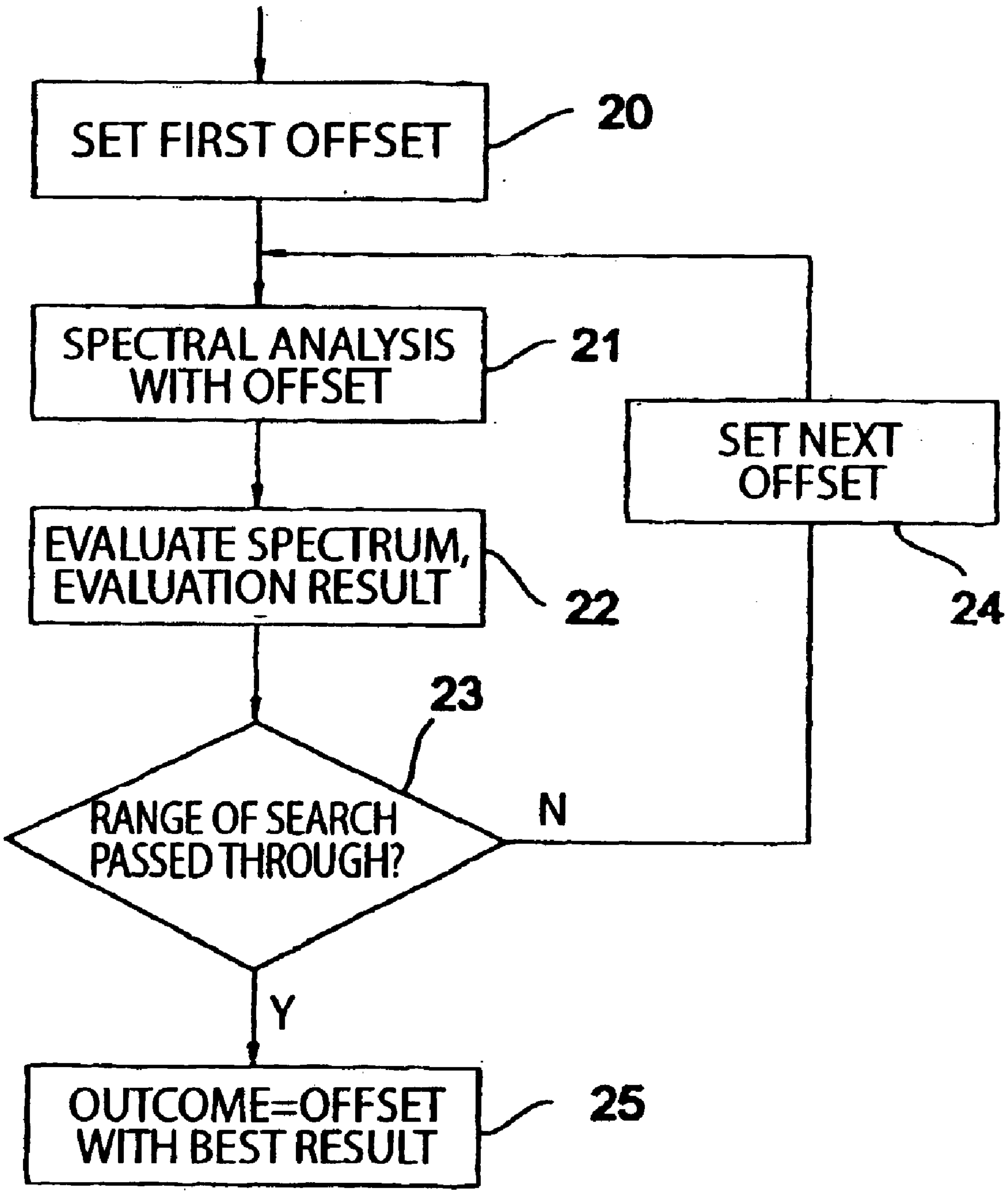
FIG. 2 shows a flow chart of a method according to the invention for determining a coding block raster.

In the following, FIG. 2 will be discussed, illustrating a flow chart of the method according to the invention. At first, there is communicated, via the control line 16 (FIG. 1), a first offset to the means 11 for picking out, i.e. a first offset is set (step 20). Following this, this segment determined by the first offset, which begins at an output sampling value of the decoded signal, is converted by the means 12 into its spectral representation, i.e. a spectral analysis of this segment having this offset is carried out (step 21). Thereafter, the spectral representation at the output of means 12 (FIG. 1) is evaluated in means 13 (FIG. 1), i.e. an evaluation of the spectrum is carried out in order to obtain an evaluation result (step 22). It is then determined in a step 23 whether all offsets desired have already been passed, i.e. whether the range of search has been passed. If this is not the case, i.e. if the decision in step 23 yields a "no", a new offset is communicated to the means 11 for picking out via control line 16 in a step 24, so that the iteration loop may be passed through again with this new offset. If the range of search has been passed then, i.e. if the decision in step 23 produces a "yes", the various evaluation results will be searched, and that evaluation result will be determined which, depending on the particular criterion, is maximum or minimum with respect to the other evaluation results, in order to then output, in a step 25, an identification of the coding block raster underlying the decoded signal, on the basis of the segment that had the most favorable evaluation result.

Figure 4:
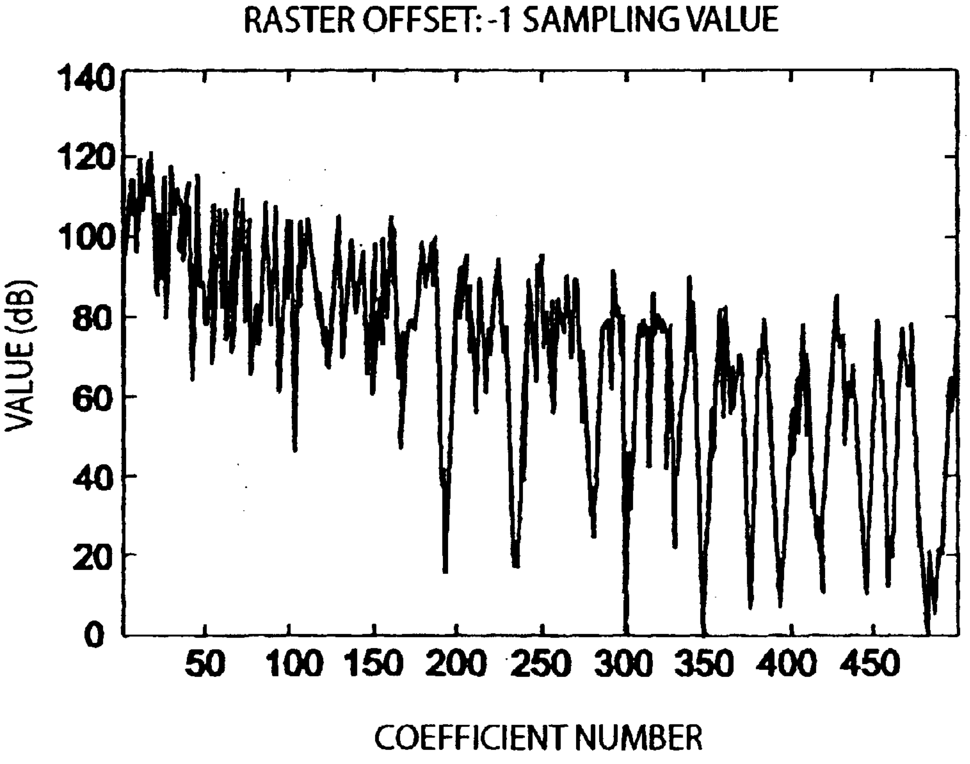
FIG. 4 shows a spectral representation of a segment of the decoded signal with a raster offset of one sampling value to the left.
Figure 5:
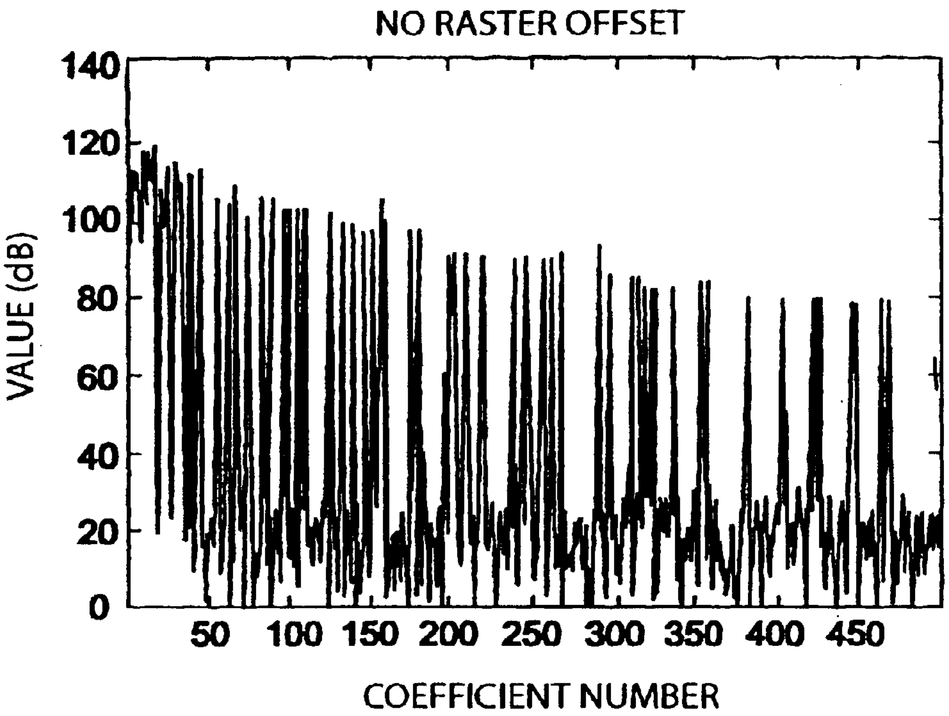
FIG. 5 shows a spectral representation of a segment of the decoded signal without raster offset.
Figure 6:
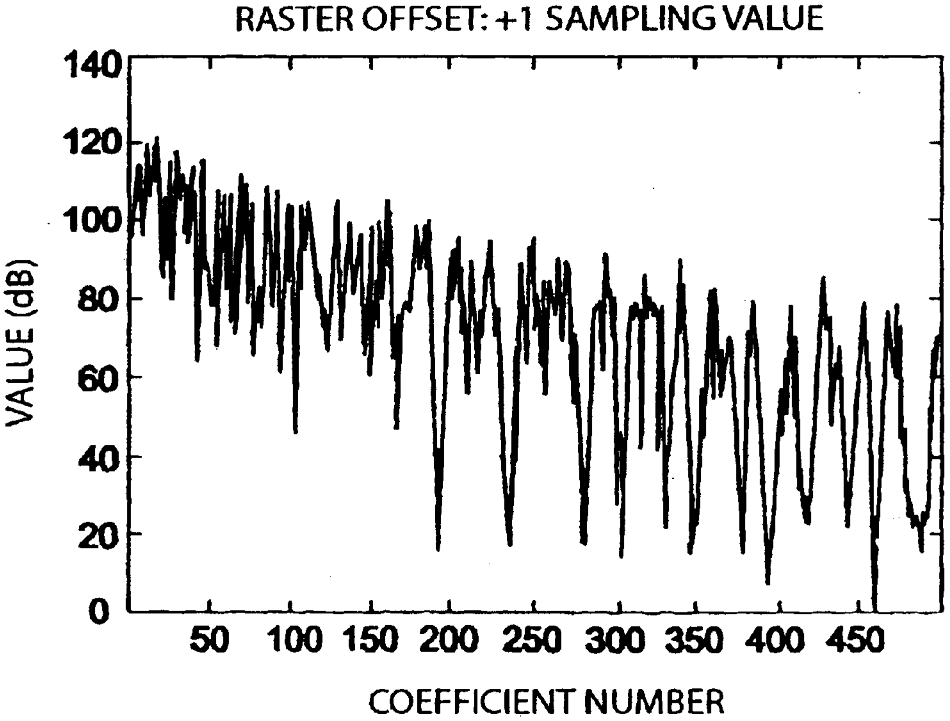
FIG. 6 shows a spectral representation of a segment of the decoded signal with a raster offset of one sampling value to the right.

In the following, FIGS. 4 to 6 will be discussed for elucidating in more detail the evaluation carried out by means 13, i.e. the step 22 of FIG. 2. FIGS. 4 to 6 illustrate the coefficient number along the abscissa. FIGS. 4 to 6 thus show graphical representations of spectrums when the coefficient number is multiplied by the bandwidth of a spectral coefficient. Shown along the ordinate of the graphical representations shown in FIGS. 4 to 6 is the absolute value of the spectral coefficients in a logarithmic representation.

In particular, FIG. 4 illustrates the spectral representation of a segment picked out, having an offset of minus one sampling value, which corresponds to alternative 33 of FIG. 3. A clearly smeared spectrum can be seen in which no clearly defined spectral coefficients are present and in which, furthermore, only quite a small number of spectral coefficients is equal to 0 or smaller than a predetermined threshold, respectively.

For comparison, there is illustrated a spectral representation of a segment picked out that has no raster offset, i.e. alternative 34 of FIG. 3. There can be seen a clearly defined spectrum in which a multiplicity of spectral lines are 0 or very small, respectively, due to the quantization in accordance with the psychoacoustic masking threshold and in which, moreover, all spectral lines have a clearly defined structure.

FIG. 6 finally illustrates a spectral representation of a segment picked out that has a raster offset of plus one sampling value, i.e. corresponding to the third alternative 35 of FIG. 3. It can be seen clearly that, in contrast to FIG. 5, the spectrum in FIG. 6 again is highly smeared.

In the following, various evaluation criteria will be dealt with in more detail. Basically, it is possible to use as criterion any property of the spectrum shown in FIG. 5 that is different from a property of the spectrums illustrated in FIGS. 4 and 6. Most prominent is that in the spectrum shown in FIG. 5, having no underlying raster offset, a large number of spectral lines is smaller than e.g. 30 dB, i.e. is approx. 70 dB lower than the significant spectral coefficients. In other words, there is a large number of spectral lines equal to 0 or smaller than 30 dB. Thus, a possible criterion that can be used here is simple counting of the spectral lines that equal 0, in order to use the spectral lines of a segment picked out that are different from 0 as evaluation result.

The segment with the least number of spectral values different from 0 or the highest number of spectral values equal 0 would then be the segment starting from the output sampling value of the decoded signal (in the instant case the sampling value 31*c* of FIG. 3), which also is the fist sampling value of the analysis window used in coding the original signal. Thus, there is no raster offset involved here.

As an alternative, it is also possible to use as predetermined criterion a decision threshold so as to output as evaluation result either the spectral values with a value above said threshold or a value below said threshold.

As an alternative, a predetermined criterion for determining the correct coding block raster may also be based on the evaluation of the rapid or abrupt fluctuation of the e.g. logarithmic amplitude of the spectral coefficients. On the average, the squared difference between two spectral coefficients in FIGS. 4 and 6 (with raster offset) will be lower than in FIG. 5 (without raster offset). As in case of the first example, a decision threshold may be used here, too, for outputting as evaluation result a "fluctuation rate" of the spectrum with a value above the threshold or a value below the threshold.

Figure 7:
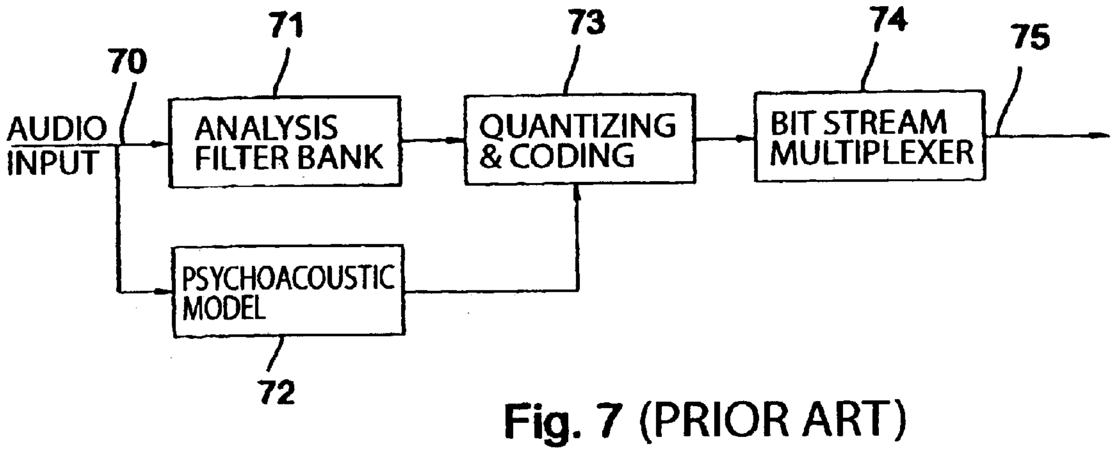
Fig. 7 (PRIOR ART)
FIG. 7 shows a block diagram of a known coder operating on the basis of spectral representation of an original signal.

It is to be pointed out here that a spectrum as shown in FIG. 5 becomes visible only if, in addition to the correct raster offset, the parameters of the analysis filter bank 71 (FIG. 7) match as well. Such parameters are, for example, the type of filter bank (e.g. DFT, DCT, MDCT), the coding block length and the window configuration. In the example illustrated in FIGS. 4 to 6, a filter bank according to MPEG-2 AAC, a window configuration in the form of a KBD window (KBD=Kaiser-Bessel-Derived) and a coding block length in the form of a long block (only-long-sequence) were utilized by way of example.

The situation in reality often is such that it is known of the decoded signal from the very beginning that is was coded and decoded again in accordance with MPEG-2 AAC. Even if this is not known, the as such iterative concept according to the present invention, as shown in FIGS. 1 and 2, can easily be modified such that means 12 for converting into the spectral representation (FIG. 1) is operated in iterative manner as well in order to base the conversion into the spectral representation on different conversion parameters so as to find out, in a double iteration loop in conjunction with the control of the segment picked out, not only the coding block raster but also the coding algorithm employed. It is pointed out that, at all times, there is only a limited number of coder candidates relevant in practical application, and therefore, the concept according to the invention also arrives at a result within a limited period of time although the coder that generated the decoded signal concerned may still be unknown.

As was already pointed out, it is generally sufficient to determine only one single coding block 32 (FIG. 3) in general form in order to determine the entire coding block raster on which the decoded signal is based. To permit reproduction of the switching over from long coding blocks to short coding blocks and maybe even to other raster partitionings, the method according to the invention can be modified to the effect that the length of a segment to be communicated to the means 11 for picking out is varied as well in order to repeat the iterative method shown in FIG. 2 for different coding block lengths. In case short windows are utilized, this will be communicated to means 12 and 13 as well. Thus, on the basis of a few raster points ascertained, the entire raster can be extrapolated or, as shown by way of the example of the short coding blocks, may even be broken down into its possibly existing fine structures.

If additional coding "tools" were utilized in the coding operation underlying the decoded signal, these configurations can be determined as well by an extended search or by additional calculations, respectively.

If the generation of the decoded signal made use of M/S stereo coding (J. D. Johnston, A. J. Ferreira: "Sum-Difference Stereo Transform Coding", IEEE ICASSP 1992, pages 569 to 571), which is also referred to as mid/side coding or sum/difference coding, the above-described iterative determination of the coding block raster is not carried out with regard to the decoded signal proper, but with regard to the sum or difference of the spectral values. If, for example, a significant number of disappearing (sum and difference) spectral coefficients shows up then, the conclusion therefrom will be M/S coding, and possibly following computations will then be carried out using the sum and difference spectral coefficients. In this regard, the predetermined criterion may be modified to the effect that individual criteria of the sum signal and of the difference signal will be suitably weighted with respect to each other, so that the predetermined criterion is based both on the sum signal and on the difference signal.

In case the generation of the decoded signal involved TNS coding (TNS=Temporal Noise Shaping) (J. Herre, J. D. Johnston: "Enhancing the Performance of Perceptual Audio Coders by Using Temporal Noise Shaping (TNS)), the coding block raster may be determined by way of the "low-frequency" spectral coefficients which usually are not subject to TNS coding. Spectral coefficients below 1 kHz normally are not subject to TNS coding. However, this value may of course vary from case to case.

Although the concept according to the invention for determining a coding block raster has been described by way of a coding block raster of an audio coding concept, it is to be understood that this concept can be applied to video coders as well. The concept according to the invention is applicable in general to all coding algorithms for all signals if these coding algorithms have the property that they are based on a spectral representation of the signal to be coded. Whenever this is the case, a spectral representation of the segment picked out can be generated for the decoded signal for different coding block raster partitionings, in order to then evaluate the spectral representation with respect to a predetermined criterion.

Finally, it is to be noted that the device according to the invention for determining a coding block raster does not necessarily have to operate in serial fashion, such that one evaluation result is produced after another, i.e. that the means 11 for picking out is controlled via the control lines 16 (FIG. 1) so as to progressively pick out a segment shifted e.g. by 1 each. Depending on the implementation side conditions, the device according to the invention may also be implemented in parallel completely or in part so that, for example, 1024 evaluation results are generated in one operating pass. Mixed serial/parallel options are possible as well so that, for example, eight parallel branches are present which then operate serially a corresponding number of times so that an entire searching range may be covered.

It is to be pointed out here as well that it is not always absolutely necessary to pass through an entire searching range. If, as in the instant case, the distinction between the spectrum without raster offset and a spectrum with minimum raster offset is possible in so clear manner, the iteration shown in FIG. 2 may also be terminated already when a predetermined criterion is fulfilled as there is actually no longer any doubt that the picked out segment tested here is a segment that is synchronous with the original coding block raster.

In addition thereto, it should be noted that the coding block raster may be identified by an arbitrary definition, and not only by the initial sampling value of a coding block. Any sampling value of a coding block of sampling values, of course, may be utilized for defining the coding block raster. Finally, the coding block raster may also be defined differently from the number of sampling values per window, such that two raster points of the coding block raster are spaced apart e.g. by twice the number of sampling values of a window.

What is claimed is:

1. A device for determining a coding block raster on which a decoded signal is based, in which the decoded signal is produced from an original signal by coding and decoding according to a coding algorithm including a coding block generating step, a conversion step and a data reducing step, said coding block generating step of the coding algorithm including partitioning the original signal according to the coding block raster into coding blocks with a specific number of time-discrete signal values, said conversion step including generating from a coding block a spectral representation of the same, and said data reducing step including removing information from the spectral representation of the original signal, said device comprising:

a picker for picking out a segment of the decoded signal, said segment beginning at an output sampling value of the decoded signal;

a processor for performing the conversion step on said segment of the decoded signal so as to provide a spectral representation of said segment;

an evaluator for evaluating the spectral representation of said segment with respect to a predetermined criterion in order to obtain an evaluation result for the segment, said device for determining a coding block raster being further arranged to pick out, convert and evaluate a plurality of segments of the decoded signal that begin at different output sampling values in order to obtain a plurality of evaluation results; and a searcher for searching the evaluation results and for outputting an identification for the coding block raster underlying the decoded signal, on the basis of the segment that has an extreme evaluation result with respect to other evaluation results.

2. A device according to claim 1, wherein the coding algorithm is one of a plurality of different coding algorithms, and wherein said processor further comprises:

a memory for storing a set of coding parameters of its own for each coding algorithm, said set of coding parameters being selected to define at least the conversion step of the corresponding coding algorithm; and a retriever for retrieving another set of coding parameters from said memory in order to provide evaluation results for an additional coding algorithm.

3. A device according to claim 2, wherein said set of coding parameters for a coding algorithm defines a filter bank underlying the same as well as a window used by the same for coding block formation.

4. A device according to claim 1, wherein the decoded signal is a stereo signal and wherein said device further comprises:

a stereo processor for stereo processing the decoded signal in order to provide at least one processed stereo signal.

5. A device according to claim 4, wherein said stereo processor performs mid/side processing such that the converter acts at least on a mid signal or on a side signal.

6. A device according to claim 1, wherein said evaluator is arranged to use as predetermined criterion the number of spectral coefficients of the spectral representation that is smaller than a predetermined threshold value.

7. A device according to claim 1, wherein said evaluator is arranged to use as predetermined criterion a measure for a fluctuation of preferably logarithmic amplitudes of spectral coefficients of the spectral representation.

8. A device according to claim 1, wherein said evaluator is arranged to examine only a segment of the spectral representation from the smallest frequency to a limit frequency with respect to said criterion.

9. A device according to claim 1, further comprising:

a writer coupled to said searcher, in order to provide the decoded signal with a mark comprising at least coding block raster information.

10. A device according to claim 1 which is arranged to process as decoded signal an audio signal or a video signal, wherein the data reducing step, in case of the audio signal, comprises a quantization depending on a psychoacoustic model and, in case of a video signal, comprises a quantization depending on a psychooptic model.

11. A method for determining a coding block raster on which a decoded signal is based, in which the decoded signal is produced from an original signal by coding and decoding according to a coding algorithm including a coding block generating step, a conversion step and a data reducing step, said coding block generating step of the coding algorithm including partitioning the original signal according to the coding block raster into coding blocks with a specific number of time-discrete signal values, said conversion step including generating from a coding block a spectral representation of the same, and said data reducing step including removing information from the spectral representation of the original signal, said method comprising:

picking out a segment of the decoded signal, said segment beginning at an output sampling value of the decoded signal;

performing the conversion step on said segment of the decoded signal so as to provide a spectral representation of said segment;

evaluating the spectral representation of said segment with respect to a predetermined criterion in order to obtain an evaluation result for the segment, said steps of picking out, performing and evaluating being carried out a plurality of times in order to pick out, convert and evaluate a plurality of segments of the decoded signal that begin at different output sampling values in order to obtain a plurality of evaluation results; and searching the evaluation results and outputting an identification for the coding block raster underlying the decoded signal, on the basis of the segment that has an extreme evaluation result with respect to other evaluation results.

* * * * *